(12) United States Patent
Ko

(10) Patent No.: US 7,733,950 B2
(45) Date of Patent: Jun. 8, 2010

(54) EQUALIZERS AND METHODS FOR EQUALIZING

(75) Inventor: Hyung-Jong Ko, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1196 days.

(21) Appl. No.: 11/318,852

(22) Filed: Dec. 28, 2005

(65) Prior Publication Data

US 2006/0140263 A1 Jun. 29, 2006

(30) Foreign Application Priority Data

Dec. 28, 2004 (KR) .................. 10-2004-0113690

(51) Int. Cl.
*H03H 7/30* (2006.01)
(52) U.S. Cl. .................................... 375/232
(58) Field of Classification Search ......... 327/551–553; 330/304; 375/232, 350
See application file for complete search history.

(56) References Cited

U.S. PATENT DOCUMENTS 6,184,748 B1 * 2/2001 Rao et al. ................. 327/552
6,304,134 B1 * 10/2001 Pavan ....................... 327/552
2007/0126408 A1 * 6/2007 Sakai ........................ 323/274

OTHER PUBLICATIONS

Chinese Office Action dated Mar. 13, 2009.

* cited by examiner

*Primary Examiner*—David C Payne
*Assistant Examiner*—Leon-Viet Q Nguyen
(74) *Attorney, Agent, or Firm*—Harness, Dickey & Pierce, P.L.C.

(57) ABSTRACT

Equalizers and methods of equalizing, wherein an equalizer may include includes n (where n is an integer $\geq$) biquad circuits each include an input node, a biquad band pass node and a biquad low pass node, a first summing circuit summing an output of the biquad band pass node of the nth biquad circuit and an output of the biquad low pass node of the nth biquad circuit, a second summing circuit subtracting the output of the biquad low pass node of the (n−1)th biquad circuit from the output of the first summing circuit and amplifying the summed result by a constant, and a third summing circuit summing an output of the second summing circuit and the output of the biquad low pass node of the nth biquad circuit, wherein the n biquad circuits are Gm-C biquad circuits each having transconductors connected in a self-feedback configuration to the biquad band pass node of the corresponding n biquad circuit. The equalizer may increase a filter bandwidth and/or maintain a specific boosting gain while reducing circuit size.

18 Claims, 6 Drawing Sheets

EQUALIZERS AND METHODS FOR EQUALIZING

PRIORITY STATEMENT

This application claims the benefit of Korean Patent Application No. 10-2004-0113690, filed on Dec. 28, 2004, in the Korean Intellectual Property Office, the disclosure of which is incorporated herein in its entirety by reference.

BACKGROUND OF THE INVENTION

1. Field of the Invention

Example embodiments of the present invention relate to equalizers and methods of equalizing, and more particularly, to equalizers having a smaller size and/or a wider bandwidth.

2. Description of the Related Art

An equalizer used for continuous-time signal processing simultaneously performs a low pass filtering function and a function of boosting a high-frequency region of an input signal to equalize the input signal. In a DVD or HDD PRML read channel signal process, for example, the equalizer simultaneously carries out an equalizing function of making the pulse shape of a signal input from media stored in a DVD or HDD into a target pulse shape and a filtering function of reducing high-frequency noise input from a pre-amplifier and a VGA.

For processing signals input from high speed disc drive read channels and various media, an equalizer having a wide bandwidth and/or a high boosting gain may be desirable. An equalizer having lower consumption power and/or a smaller circuit area, for example, implemented as a system on chip (SOC) may also be desirable. Thus, it is difficult to design an equalizer having a wider bandwidth.

A wide bandwidth equalizer may use a switched-capacitor (SC) filler or a transconductor-capacitor (Gm-C) filter. A Gm-C filter has an open loop structure and is suitable for a high-frequency operation. A wide bandwidth equalizer may include a circuit for boosting high-frequency components. The −3 dB frequency of a Gm-C filter is determined by a ratio of transconductance (gm) to integrating capacitance (C), that is, gm/C. Thus, to increase the bandwidth of a Gm-C filter, the transconductance gm should be increased and the capacitance C should be decreased. The −3 dB frequency is a factor determining AC response characteristic of the filter and corresponds to a frequency at which the gain of the filter becomes −3 dB.

To increase the bandwidth of a Gm-C filter, an integrating capacitor having a smaller capacitance may be used. The integrating capacitor may be designed by scaling a normalized integrating capacitance determined based on a filter order and a filter type (for example, Bessel, Butterworth, Equiripple filters). The actual capacitance obtained by scaling a normalized capacitance with a desired factor must be larger than a parasitic capacitance. For example, when normalized capacitances of a third-order filter are C1=0.1, C2=0.2 and C3=0.3 and a scale factor is 5 p, the actual capacitances are 0.5 pF, 1.0 pF and 1.5 pF. If a parasitic capacitance, which is added to each integrating node caused by a plurality of transconductors connected in parallel with a circuit for boosting, is 1.0 pF, the scale factor must be larger than 10 p. This is because, when the scale factor is 5 p, there is no problem in the nodes to which C2 and C3 are connected but the capacitance of the node connected to C1, 0.5 pF, is smaller than the parasitic capacitance, 1 pF.

If there is no circuit for boosting connected to the node of C1 but exists only a parasitic capacitance of 0.4 pF caused by a plurality of transconductors, all the capacitances can be scaled even if the scale factor is 5 p when an integrating capacitance of 0.1 pF is added to the node of C1. However, the total capacitance can be increased or decreased according to a boosting algorithm to increase or decrease a chip size.

FIG. 1 is a circuit diagram of a conventional equalizer 100. Referring to FIG. 1, the conventional equalizer 100 is a 7th-order equalizer and includes a lossy integrator 102, three Gm-C biquad circuits 104, 106 and 108, and a boosting circuit 110. The equalizer 100 is of the equiripple type and constructed by adding the boosting circuit 110 to a 7th-order low pass filer.

Each of the three Gm-C biquad circuits 104, 106 and 108 includes a first transconductor 118 connected between an input node 112 and a biquad band pass node 114, a first capacitor 120 connected between the biquad band pass node 114 and a ground voltage, a second transconductor 122 connected between the biquad band pass node 114 and a biquad low pass node 116, a third transconductor 124 that is connected between the biquad band pass node 114 and the biquad low pass node 116 and forms a feedback loop with the second transconductor 122, a fourth transconductor 126 connected to the biquad low pass node 116 in a self-feedback configuration, and a second capacitor 128 connected between the biquad low pass node 116 and the ground voltage.

A biquad circuit is a second-order filter and may be composed of operational amplifiers or transconductors as shown in FIG. 1. When a plurality of biquad circuits are serially connected, a filter having a more than fourth order can be obtained.

The boosting circuit 110 boosts a high-frequency region of the equalizer and includes an inverting transconductor 130 connected between the input node of the first Gm-C biquad circuit 104 and the input node of the second Gm-C biquad circuit 106, and a non-inverting transconductor 132 connected between the input node of the second Gm-C biquad circuit 106 and the input node of the third Gm-C biquad circuit 108. A non-inverting transconductor has input and output signals having the same phase and an inverting transconductor has input and output signals having a phase difference of 180°.

The normalized capacitances of the 7th-order equiripple filter of FIG. 1 are represented in Table 1.

TABLE 1

| Capacitor | Normalized capacitance |
| --- | --- |
| C1 | 1.1610 |
| C2 | 1.2795 |
| C3 | 0.5938 |
| C4 | 0.5224 |
| C5 | 0.6485 |
| C6 | 0.2133 |
| C7 | 0.8729 |

In the structure of the equalizer 100 shown in FIG. 1, the outputs of the transconductors 130 and 132 for boosting are connected to integrating nodes of capacitors C3 and C5, that is, the biquad low pass node of the first biquad circuit 104 and the biquad low pass node of the second biquad circuit 106. Accordingly, parasitic capacitances generated from the outputs of the transconductors 130 and 132 are added to the integrating nodes connected to the capacitors C3 and C5, and thus parasitic capacitances of the integrating nodes of the capacitors C3 and C5 are larger than parasitic capacitances of capacitors C1, C2, C4 and C6. Referring to Table 1, the equalizer 100 is not efficient with respect to capacitor sizes because the normalized capacitances of the capacitors C3 and C5 are smaller than the normalized capacitance of the capacitor C1 or C2. That is, a large parasitic capacitance is added to a node having a small normalized capacitance to increase a scale factor for making the actual total capacitance, and thus other integrating capacitances should be scaled with a large scale factor.

To produce a high-frequency filter using identical transconductors, the total capacitance of each integrating node must be small. The total capacitance of one integrating node is represented by Ctot=Cnor×Sf=Sint×Cpar, where Ctot denotes the total capacitance, Cnor denotes a normalized capacitance, Sf is a scale factor, Sint is an integrating capacitance connected to a circuit, and Spar is a parasitic capacitance added to the circuit.

An Nth-order filter has N integrating nodes, N integrating capacitances, N normalized capacitances, N parasitic capacitances and one scale factor. If the parasitic capacitance Cpar is 0 at each node, Cnor×Sf=Cint. However, Cint=Cnor×Sf-Cpar because the parasitic capacitance Cpar is not zero in the actual circuit.

For example, when Cnor2=1.2795, Cnor3=0.5938, Sf=3 p and Cpar=0 in a seventh-order filter, Ctot2=3.8385 pF and Ctot3=1.7814 pF. When Cpar2=2 pF and Cpar3=1.5 pF, Cint2=1.8385 pF and Cint3=0.2814 pF. When Cpar2=2 pF and Cpar3=2.5 pF, however, the second node is normally scaled but the third node is not properly scaled because Ctot3 is smaller than Cpar3. The scale factor Sf must be increased and thus all the seven integrating capacitances are increased. This increases circuit size.

In the equalizer 100 of FIG. 1, a boosting gain K is determined by a ratio of transconductance gmk of transconductors added to the equalizer 100 for generating zero to transconductance gm of transconductors used to constitute the filter. That is, K∝gmk/gm. Accordingly, when a large-size transconductor is used to constitute a high-frequency filter, gm is increased and thus transconductors for boosting should be increased in the same ratio to obtain a specific boosting gain K. Furthermore, the sizes of transconductors added to the filter should be further increased in order to raise the boosting gain K.

Accordingly, conventional equalizers may have a problem that its size is increased in order to increase its bandwidth, obtain a specific boosting gain at a high frequency and/or raise the boosting gain. That is, when transconductance is increased to widen the bandwidth of a Gm-C filter in a conventional equalizer, the total capacitance is increased and thus the bandwidth cannot be widened. When capacitances are reduced, integrating capacitances may become smaller than parasitic capacitance. When the integrating capacitances and transconductance are increased, chip size is increased. Furthermore, when a boosting gain is raised using the conventional equalizer, sizes of transconductors should be increased to result in an increase in the chip size.

SUMMARY OF THE INVENTION

Example embodiments of the present invention provide an equalizer having a smaller circuit size and/or a larger bandwidth while maintaining a desired boosting gain.

Example embodiments of the present invention also provide an equalizer which may control capacitance scaling and/or a boosting gain and generate a smaller parasitic capacitance when controlling the capacitance scaling and boosting gain such that an equalizer characteristic is not varied.

According to an example embodiment of the present invention, there is provided an equalizer including first and second biquad circuits and first, second and third summing circuits. The first biquad circuit includes a first input node, a first biquad band pass node, and a first biquad low pass node. The second biquad circuit may include a second input node connected to the first biquad low pass node, a second biquad band pass node, and a second biquad low pass node. The first summing circuit may sum the output of the second biquad band pass node and the output of the second biquad low pass node. The second summing circuit may subtract the output of the first biquad low pass node from the output of the first summing circuit and amplify the summed result by a constant. The third summing circuit may sum the output of the second summing circuit and the output of the second biquad low pass node. The first and second biquad circuits may be Gm-C biquad circuits having transconductors connected in a self-feedback configuration to the first and second biquad band pass nodes, respectively.

The first and third summing circuits may be first and second operational amplifiers, respectively, each summing two input signals. The second summing circuit may include a third operational amplifier subtracting the output of the first biquad low pass node from the output of the first summing circuit, and a fourth operational amplifier amplifying the output of the third operational amplifier by a constant.

Each of the biquad circuits may include a first transconductor connected between the input node and the biquad band pass node of each biquad circuit, a first capacitor connected between the biquad band pass node of each biquad circuit and a ground voltage, a second transconductor connected in a self-feedback configuration to the biquad band pass node of each biquad circuit, a third transconductor connected between the biquad band pass node and the biquad low pass node of each biquad circuit, a fourth transconductor connected between the biquad band pass node and the biquad low pass node of each biquad circuit, the fourth transconductor forming a feedback loop with the third transconductor, and a second capacitor connected between the biquad low pass node of each biquad circuit and the ground voltage.

The first and third transconductors may be non-inverting transconductors and the second and fourth transconductors may be inverting transconductors.

The equalizer may further include a plurality of biquad circuits, a last of which is connected to the first input node of the first biquad circuit, and a lossy integrator, connected to a first of the plurality of biquad circuits.

The lossy integrator may include a first transconductor connected between an input node and an integrating node, a second transconductor connected to the integrating node in a self-feedback configuration, and a first capacitor connected between the integrating node and a ground voltage. The first transconductor may be a non-inverting transconductor and the second transconductor may be an inverting transconductor.

According to another example embodiment of the present invention, there is provided an equalizer including a lossy integrator, first, second and third biquad circuits, and first, second and third summing circuits. The lossy integrator may include a first input node and an integrating node. The first biquad circuit may include a second input node connected to the integrating node, a first biquad band pass node, and a first biquad low pass node. The second biquad circuit may include a third input node connected to the first biquad low pass node, a second biquad band pass node, and a second biquad low pass node. The third biquad circuit may include a fourth input node connected to the second biquad low pass node, a third biquad band pass node, and a third biquad low pass node. The first summing circuit may sum the output of the third biquad band pass node and the output of the third biquad low pass node. The second summing circuit may subtract the output of the second biquad low pass node from the output of the first summing circuit and amplify the summed result by a constant. The third summing circuit may sum the output of the second summing circuit and the output of the third biquad low pass node. The first, second and third biquad circuits may be Gm-C biquad circuits having transconductors connected in a self-feedback configuration to the first, second and third biquad band pass nodes, respectively.

According to another example embodiment of the present invention, there is provided an equalizer including n (where n is an integer $\geq 2$) biquad circuits, and first, second and third summing circuits. Each of the n biquad circuits may include an input node, a biquad band pass node and a biquad low pass node. The first summing circuit may sum the output of the biquad band pass node of the nth biquad circuit and the output of the biquad low pass node of the nth biquad circuit. The second summing circuit may subtract the output of the biquad low pass node of the (n-1)th biquad circuit from the output of the first summing circuit and amplify the summed result by a constant. The third summing circuit may sum the output of the second summing circuit and the output of the biquad low pass node of the nth biquad circuit. The n biquad circuits may be Gm-C biquad circuits having transconductors connected in a self-feedback configuration to the biquad band pass nodes of the corresponding n biquad circuits.

According to another example embodiment of the present invention, each of the n (where n is an integer $\geq$) biquad circuits includes at least one transconductor and each of the first summing circuit, the second summing circuit, and the third summing circuit includes at least one operational amplifier.

According to another example embodiment of the present invention, an equalizer may include a filtering part including n (where n is an integer $\geq 2$) biquad circuits, each including at least one transconductor, receiving an input voltage and outputting a filtered voltage and an equalizing part including at least one operational amplifier, receiving at least one intermediate voltage from the filtering part and outputting an equalized voltage.

According to another example embodiment of the present invention, the equalizing part includes no transconductors.

According to another example embodiment of the present invention, a method of equalizing includes filtering an input voltage and outputting at least one intermediate voltage and a filtered voltage using at least one transconductor and receiving the at least one intermediate voltage and boosting an equalized voltage using at least one operational amplifier.

According to another example embodiment of the present invention, the boosting is performed without transconductors.

BRIEF DESCRIPTION OF THE DRAWINGS

The above and other features and advantages of the example embodiments of present invention will become more apparent by describing in detail example embodiments thereof with reference to the attached drawings in which.

DETAILED DESCRIPTION OF EXAMPLE EMBODIMENTS OF THE INVENTION

Figure 1:
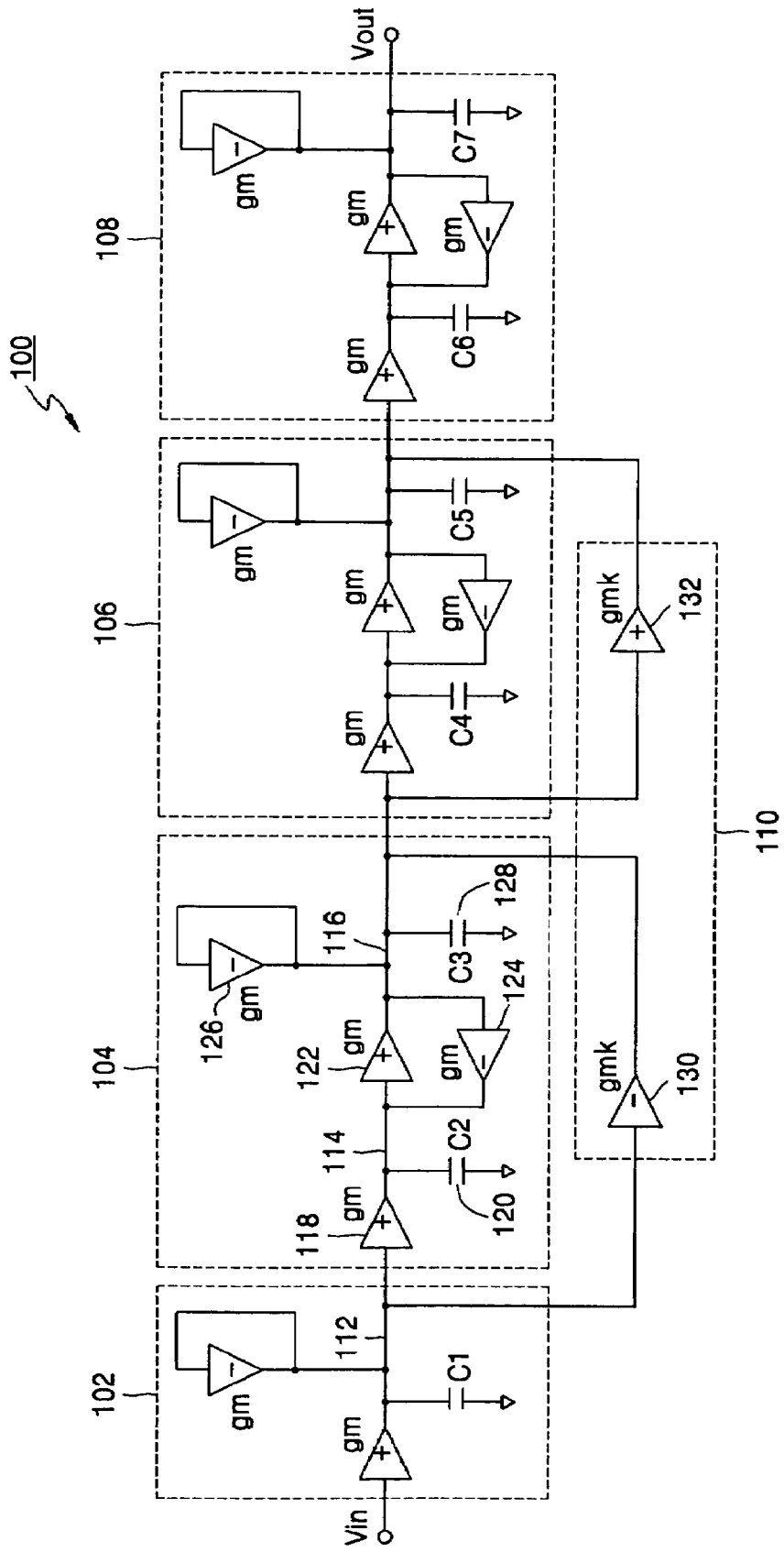
FIG. 1 is a circuit diagram of a conventional equalizer.

The present invention will now be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

Figure 2:
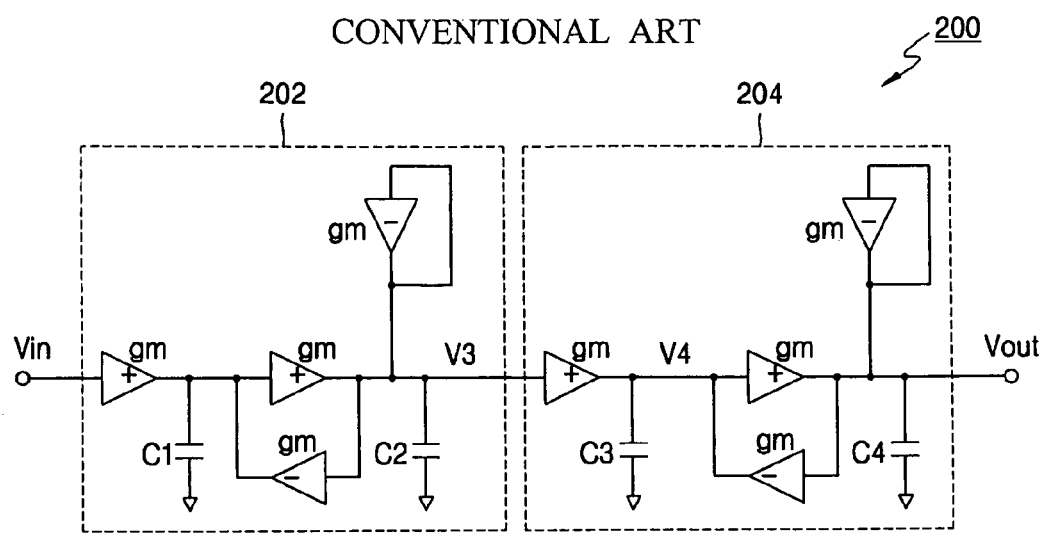
FIG. 2 is a circuit diagram of a conventional fourth-order Gm-C filter.

FIG. 2 is a circuit diagram of a conventional fourth-order Gm-C filter 200. Referring to FIG. 2, the fourth-order Gm-C filter 200 may include serially connected first and second Gm-C biquad circuits 202 and 204. Each of the first and second Gm-C biquad circuits 202 and 204 may include at least two non-inverting transconductors, at least two inverting transconductors, and/or at least two integrating capacitors.

An equalizer must have both a filtering function and a boosting function. The filtering function may be achieved using a Gm-C filter and the boosting function can be obtained by connecting a boosting transconductor to an output signal of each node or through calculation for the output signal.

Filtering and boosting characteristics of an equalizer may be determined by zero and pole values of a transfer function.

The pole value of the transfer function may determine a filtered frequency band and the zero value determines the boosting characteristic.

In the Gm-C filter shown in FIG. 2, a transfer function from an input node Vin of the first Gm-C biquad circuit 202 to a biquad low pass node V3 of the first Gm-C biquad circuit 202 may be represented as follows.

$$\frac{V3}{Vin} = \frac{gm^2}{S^2 C_1 C_2 + SC_1 gm + gm^2} \quad \text{[Equation 1]}$$

A transfer function from the input node Vin of the first Gm-C biquad circuit 202 to a biquad band pass node V4 of the second Gm-C biquad circuit 204 may be represented as follows.

$$\frac{V4}{Vin} = \frac{(SC_2 gm^3 + gm^4)}{(S^2 C_1 C_2 + SC_1 gm + gm^2)(S^2 C_3 C_4 + SC_3 gm + gm^2)} \quad \text{[Equation 2]}$$

A transfer function from the input node Vin of the first Gm-C biquad circuit 202 to a biquad low pass node Vout of the second Gm-C biquad circuit 204 may be represented as follows.

$$\frac{Vout}{Vin} = \frac{gm^4}{(S^2 C_1 C_2 + SC_1 gm + gm^2)(S^2 C_3 C_4 + SC_3 gm + gm^2)} \quad \text{[Equation 3]}$$

To obtain a specific phase shift rate irrespective of frequency in a boosting operation, real zero must be generated in the transfer function. That is, the numerator of the transfer function must have a form of $-AS^2+B$ for the boosting operation.

However, even when the transfer functions of Equations 1, 2 and 3 are multiplied by constants and the results are added or subtracted, the numerators of the transfer functions have a form of $-AS^2+BS+C$, generating complex zero. That is, the term S is left in the numerators. Thus, when an equalizer is constructed using the Gm-C filter of FIG. 2, complex zero is generated in the transfer functions.

When the Gm-C filter of FIG. 2 is used, real zero cannot be obtained when an equalizer is constructed using a simple operational amplifier without using transconductor for obtaining a boosting gain. Accordingly, example embodiments of the present invention are directed to an equalizer using a modified Gm-C filter. Example embodiments of the present invention provide an equalizer using a biquad circuit, for example, the biquad circuit of FIG. 3, modified from the biquad circuit of FIG. 2 to solve the aforementioned problem.

Figure 3:
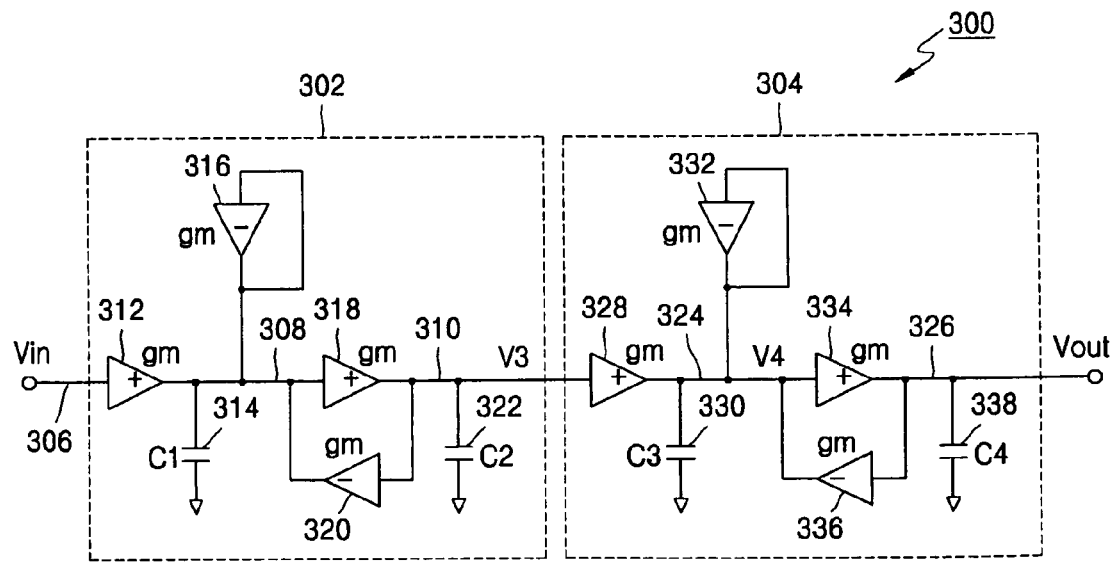
FIG. 3 is a circuit diagram of a Gm-C filter used in an equalizer according to an example embodiment of the present invention.

FIG. 3 is a circuit diagram of a fourth-order Gm-C filter 400 used in an equalizer according to an example embodiment of the present invention. Referring to FIG. 3, the fourth-order Gm-C filter 400 may include serially connected first and second Gm-C biquad circuits 302 and 304.

The first Gm-C biquad circuit 302 may include a first transconductor 312 connected between a first input node 306 and a first biquad band pass node 308, a first capacitor 314 connected between the first biquad band pass node 308 and a ground voltage, a second transconductor 316 connected to the first biquad band pass node 308 in a self-feedback configuration, a third transconductor 318 connected between the first biquad band pass node 308 and a first biquad low pass node 310, a fourth transconductor 320 that is connected between the first biquad band pass node 308 and the first biquad low pass node 310 and forms a feedback loop with the third transconductor 318, and/or a second capacitor 322 connected between the first biquad low pass node 310 and the ground voltage. The first and third transconductors 312 and 318 may be non-inverting transconductors and the second and fourth transconductors 316 and 320 may be inverting transconductors.

The second Gm-C biquad circuit 304 may include a fifth transconductor 328 connected between the first biquad low pass node 310 and a second biquad band pass node 324, a third capacitor 330 connected between the second biquad band pass node 324 and the ground voltage, a sixth transconductor 332 connected to the second biquad band pass node 324 in a self-feedback configuration, a seventh transconductor 334 connected between the second biquad band pass node 324 and a second biquad low pass node 326, an eighth transconductor 336 that is connected between the second biquad band pass node 324 and the second biquad low pass node 326 and forms a feedback loop with the seventh transconductor 334, and/or a fourth capacitor 338 connected between the second biquad low pass node 326 and the ground voltage. The fifth and seventh transconductors 328 and 334 may be non-inverting transconductors and the sixth and eighth transconductors 332 and 336 may be inverting transconductors.

Comparing the biquad circuits 302 and 304 to the biquad circuits 202 and 204, the inverting transconductors having a self-feedback configuration are not connected to the biquad low pass nodes but to the biquad band pass nodes.

In the Gm-C filter 300 of FIG. 3, the transfer function from the input node Vin of the first Gm-C biquad circuit 302 to the biquad band pass node V3 of the first Gm-C biquad circuit 302 may be represented as follows.

$$\frac{V3}{Vin} = \frac{gm^2}{S^2 C_1 C_2 + SC_1 gm + gm^2} \quad \text{[Equation 4]}$$

The transfer function from the input node Vin of the first Gm-C biquad circuit 302 to the biquad band pass node V4 of the second Gm-C biquad circuit 304 may be represented as follows.

$$\frac{V4}{Vin} = \frac{SC_4 gm^3}{(S^2 C_1 C_2 + SC_1 gm + gm^2)(S^2 C_3 C_4 + SC_4 gm + gm^2)} \quad \text{[Equation 5]}$$

The transfer function from the input node Vin of the first Gm-C biquad circuit 302 to the biquad low pass node Vout of the second Gm-C biquad circuit 304 may be represented as follows.

$$\frac{Vout}{Vin} = \frac{gm^4}{(S^2 C_1 C_2 + SC_1 gm + gm^2)(S^2 C_3 C_4 + SC_4 gm + gm^2)} \quad \text{[Equation 6]}$$

When Equations 4, 5 and 6 are respectively multiplied by $-K$, $K$ and $K+1$ and the results are summed in order to make the numerator of the transfer function of an equalizer have only a squared term of S and constant terms, Equation 7 is obtained.

$$-K\frac{V3}{Vin} + K\frac{V4}{Vin} + (K+1)\frac{Vout}{Vin} = \frac{-S^2KC_3C_4gm^2 + gm^4}{(S^2C_1C_2 + SC_2gm + gm^2)(S^2C_3C_4 + SC_4gm + gm^2)}$$ [Equation 7]

That is, when Equations 4, 5 and 6 are multiplied by −K, K and K+1 respectively, the numerator of Equation 7 has a value of −S2KC3C4gm2+gm4 corresponding to the form of −AS2+B. That is, the term S is removed and the transfer function can obtain real zero. A zero frequency obtained from Equation 7 may be represented as follows.

$$S = \pm \frac{gm}{\sqrt{KC_3C_4}}$$ [Equation 8]

It may be known from Equation 8 that the boosting gain is determined by the constant K. That is, the zero frequency may be decreased to raise the boosting gain when K is increased but the zero frequency is increased to reduce the boosting gain when K is decreased.

Even when the constant K is varied, the denominator of Equation 7 is not affected by the varied K, and thus a pole frequency is not changed. Accordingly, it is possible to vary only the boosting gain, without changing the −3dB frequency of the Gm-C filter 300 even when the constant K is varied. That is, a filtered frequency range is not changed and only the boosting gain is controllable because the pole frequency is not varied.

Boosting resolution is determined by a variation in the constant K. That is, the boosting resolution may be improved as the variation in the constant K is increased. The arithmetic operation of Equation 7 may be performed using summing operational amplifiers and an operational amplifier having a gain K.

Figure 4:
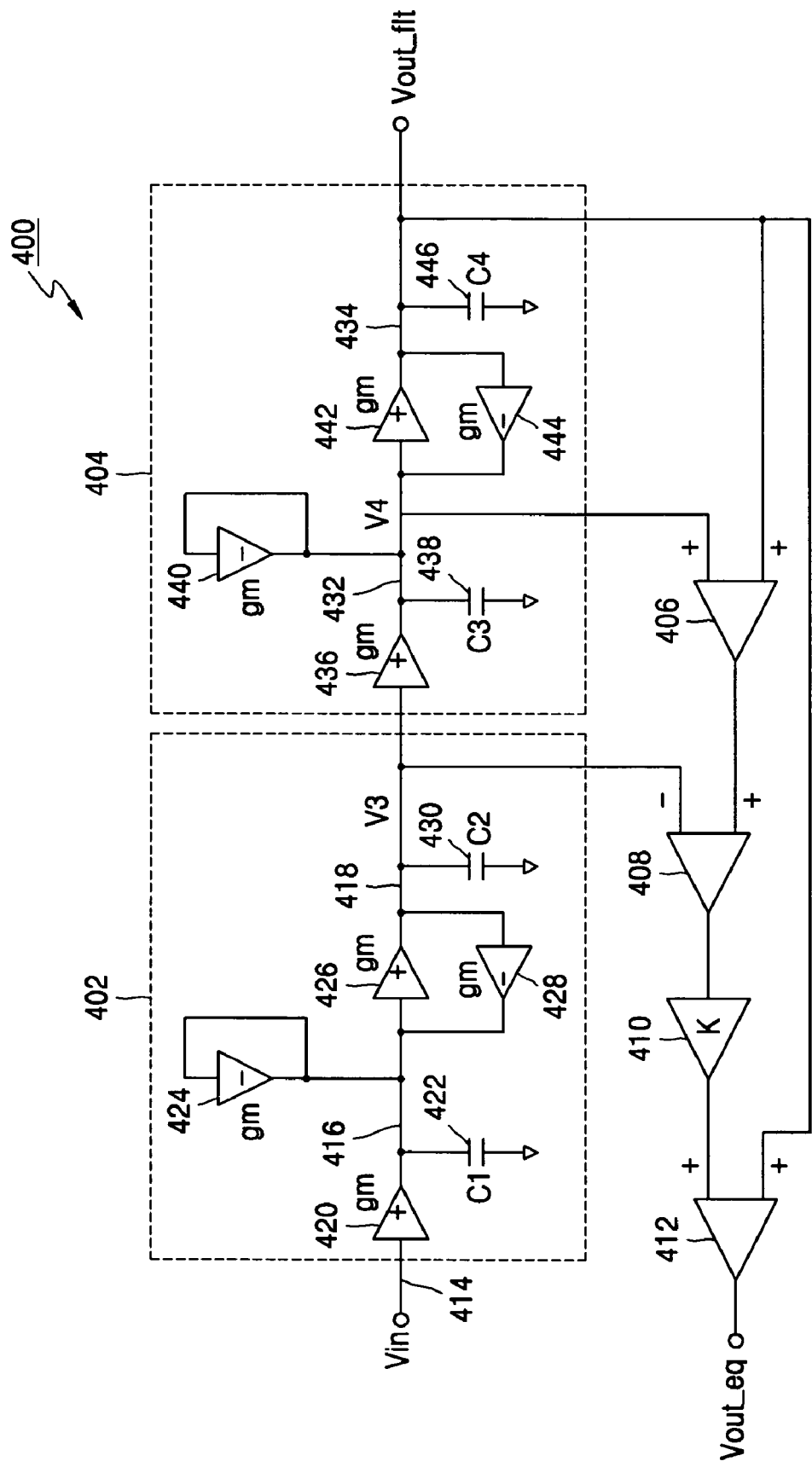
FIG. 4 is a circuit diagram of an equalizer according to an example embodiment of the present invention.

FIG. 4 is a circuit diagram of an equalizer 400 according to an example embodiment of the present invention. The example equalizer 400 embodies Equation 7 using the Gm-C filter of FIG. 3.

Referring to FIG. 4, the equalizer 400 may include a first biquad circuit 402 having a first input node 414, a first biquad band pass node 416 and a first biquad low pass node 418, a second biquad circuit 404 having a second input node connected to the first biquad low pass node 418, a second biquad band pass node 432 and a second biquad low pass node 434, a first operational amplifier 406 summing up the output of the second biquad band pass node 432 and the output of the second biquad low pass node 434, a second operational amplifier 408 subtracting the output of the first biquad low pass node 418 from the output of the first operational amplifier 406, a third operational amplifier 410 amplifying the output of the second operational amplifier 408 by a desired constant K, and/or a fourth operational amplifier 412 summing up the output of the third operational amplifier 410 and the output of the second biquad low pass node 434.

The first biquad circuit 402 may include a first transconductor 420 connected between the first input node 414 and the first biquad band pass node 416, a first capacitor 422 connected between the first biquad band pass node 416 and a ground voltage, a second transconductor 424 connected to the first biquad band pass node 416 in a self-feedback configuration, a third transconductor 426 connected between the first biquad band pass node 416 and the first biquad low pass node 418, a fourth transconductor 428 that is connected between the first biquad band pass node 416 and the first biquad low pass node 418 and forms a feedback loop with the third transconductor 426, and/or a second capacitor 430 connected between the first biquad low pass node 418 and the ground voltage. The first and third transconductors 320 and 426 may be non-inverting transconductors and the second and fourth transconductors 424 and 428 may be inverting transconductors.

The second biquad circuit 404 may include a fifth transconductor 436 connected between the second input node 418 and the second biquad band pass node 432, a third capacitor 438 connected between the second biquad band pass node 432 and the ground voltage, a sixth transconductor 440 connected to the second biquad band pass node 432 in a self-feedback configuration, a seventh transconductor 442 connected between the second biquad band pass node 432 and the second biquad low pass node 434, an eighth transconductor 444 that is connected between the second biquad band pass node 432 and the second biquad low pass node 434 and forms a feedback loop with the seventh transconductor 442, and/or a fourth capacitor 446 connected between the second biquad low pass node 434 and the ground voltage. The fifth and seventh transconductors 436 and 442 may be non-inverting transconductors and the sixth and eighth transconductors 440 and 444 may be inverting transconductors.

In FIG. 4, the output of the equalizing part corresponds to the output Vout_eq of the fourth operational amplifier 412 and the output of the low pass filter part corresponds to the output Vout_flt of the second biquad low pass node 434.

Referring to FIG. 4, only the three summing operational amplifiers 406, 408 and 412 and one operational amplifier 410 having the gain K are added to obtain the boosting gain. Thus, the example equalizer 400 may be constructed with a smaller size than a conventional equalizer using transconductors having a large chip size.

As described above, the bandwidth of a Gm-C filter may be determined by gm/C. Even when the transconductance Gm is increased or capacitance C is reduced in order to widen the frequency bandwidth, a parasitic capacitance added to an integrating node is small enough that the total capacitance is not affected. Because the added parasitic capacitance is relatively small even when the capacitance is reduced in order to widen the frequency band of the equalizer, filtering and equalizing operations may be performed in a wide frequency bandwidth using transconductors having small transconductance values.

While the boosting gain of the conventional equalizer is determined by gmk/gm (where gmk is transconductance of a transconductor for boosting), the equalizer according to an example embodiment of the present invention need not include a transconductor having gmk for obtaining the boosting gain and thus the boosting gain need not be affected even when grn is raised to increase the bandwidth. Furthermore, the equalizer 400 according to an example embodiment of the present invention may control only the gain K of the operational amplifier to control the boosting gain. Thus, there is no need to control the sizes of the transconductors. In addition, a larger parasitic capacitance due to a transconductor for boosting is not generated because the equalizer 400 does not include a transconductor for boosting.

In the conventional equalizer including separate transconductors for boosting, the sizes of the transconductors for boosting should be increased to obtain a specific boosting gain when the equalizer uses transconductors having a large size to realize a high frequency filter. However, the equalizer 400 according to an example embodiment of the present invention does not need to increase the sizes of transconductors added even when realizing a high frequency filter because the equalizer 400 does not use separate transconductors for boosting.

Figure 5:
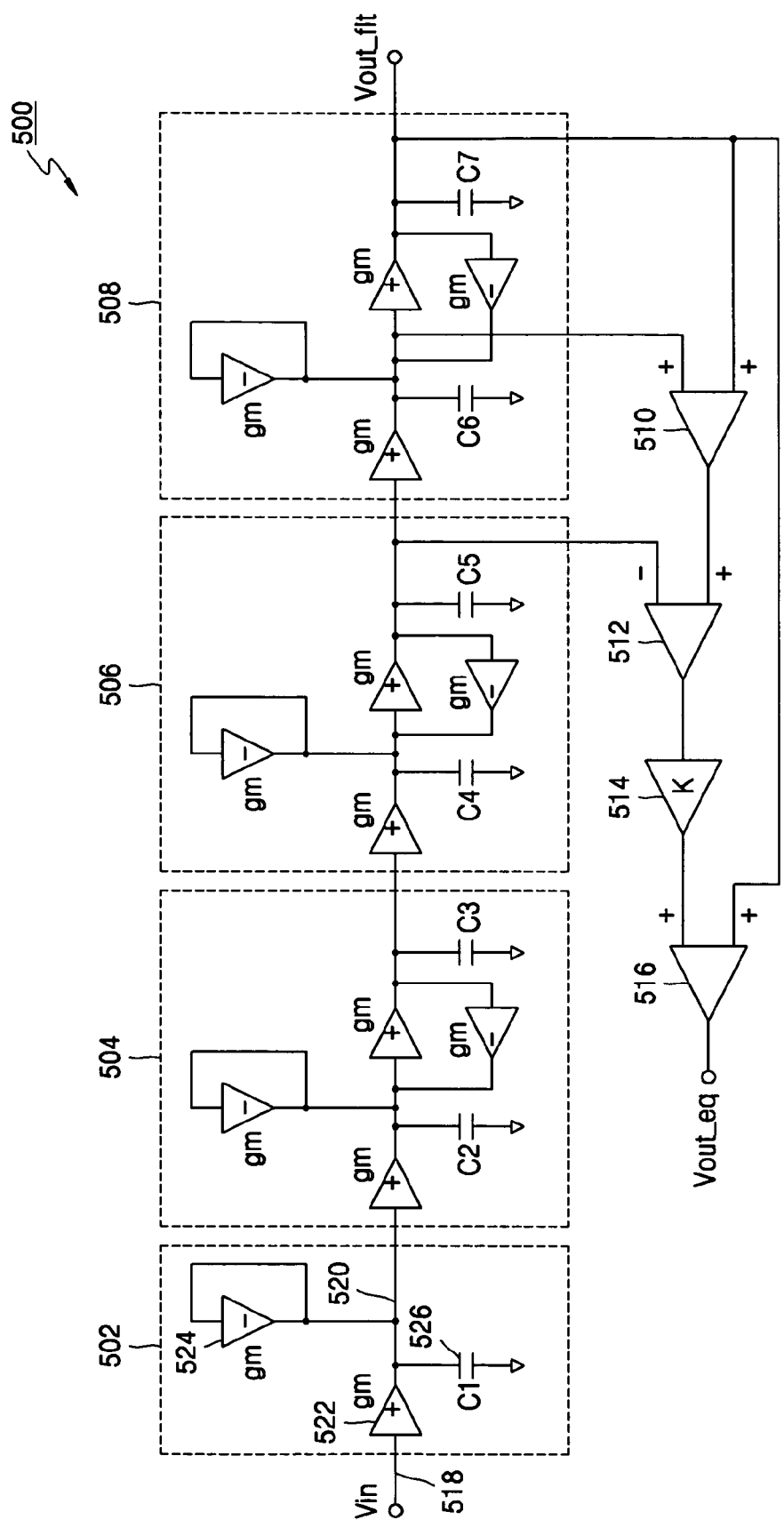
FIG. 5 is a circuit diagram of an equalizer according to another example embodiment of the present invention.

FIG. 5 is a circuit diagram of an equalizer 500 according to another example embodiment of the present invention. The equalizer 500 may include a lossy integrator 502, first, second and third biquad circuits 504, 506 and 508, three summing operational amplifiers 510, 512 and 516, and/or a gain operational amplifier 514.

The equalizer 500 constructs a seventh-order Gm-C filter using the three biquad circuits 504, 506 and 508 and one lossy integrator 502 and constructs an equalizing unit using the four operational amplifiers 510, 512, 514 and 516. The output of the equalizing unit corresponds to the output Vout_eq of the operational amplifier 516 and the output of the Gm-C filter corresponds to the output Vout_flt of a third biquad low pass node.

The lossy integrator 502 may include a non-inverting transconductor 522 connected between an input node 518 and an integrating node 520, an inverting transconductor 524 connected to the integrating node 520 in a self-feedback configuration, and/or a capacitor 526 connected between the integrating node 520 and a ground voltage. The first, second and third biquad circuits 504, 506 and 508 may have a configuration similar to those of the biquad circuits of FIGS. 3 and 4.

The first operational amplifier 510 may sum the output of a biquad band pass node and the output of a biquad low pass node of the third biquad circuit 508, and the second operational amplifier 512 may subtract the output of a biquad low pass node of the second biquad circuit 506 from the output of the first operational amplifier 510. The third operational amplifier 514 may amplify the output of the second operational amplifier 512 by K, and the fourth operational amplifier 516 may sum the output of the third operational amplifier 514 and the output of the biquad low pass node of the third biquad circuit 508.

The equalizer 500 does not generate the term S in the numerator of Equation 7 because the lossy integrator 502 and the biquad circuits 504, 506 and 508 are placed before the equalizing unit of the equalizer 400 of FIG. 4 and serially connected to the equalizing unit. Thus, the output of the fourth operational amplifier 516 may obtain a boosting gain from real zero. Furthermore, the equalizer 500 may construct the equalizing unit only with operational amplifiers without using separate transconductors for boosting. Accordingly, the circuit size of the equalizer 500 may be reduced. Moreover, a parasitic capacitance caused by the operational amplifiers in the equalizer 500 includes only gate capacitances of MOSFETs, and thus it is smaller than the parasitic capacitance of the conventional equalizer and insignificantly affects the total integrating capacitance. Furthermore, the equalizer 500 may easily perform higher frequency filtering and/or widen its frequency bandwidth because it can easily control scaling of capacitance.

Example normalized capacitances of integrating capacitors used in the equalizer 500 is represented in Table 2.

TABLE 2

| Capacitor | Normalized capacitance |
|---|---|
| C1 | 1.1610 |
| C2 | 0.5938 |
| C3 | 1.2795 |
| C4 | 0.6485 |
| C5 | 0.5224 |
| C6 | 0.8729 |
| C7 | 0.2133 |

Comparing the normalized capacitances of Table 2 to the normalized capacitances of FIG. 1, the positions of the capacitors of each biquad circuit are changed. That is, the capacitance values of two capacitors constructing each of the biquad circuits 504, 506 and 508 are changed except the capacitor C1 constructing the lossy integrator 502.

FIGS. 6, 7, 8 and 9 are graphs showing example simulation results obtained by scaling the normalized capacitances of Table 2 to design the example equalizer 500.

Figure 6:
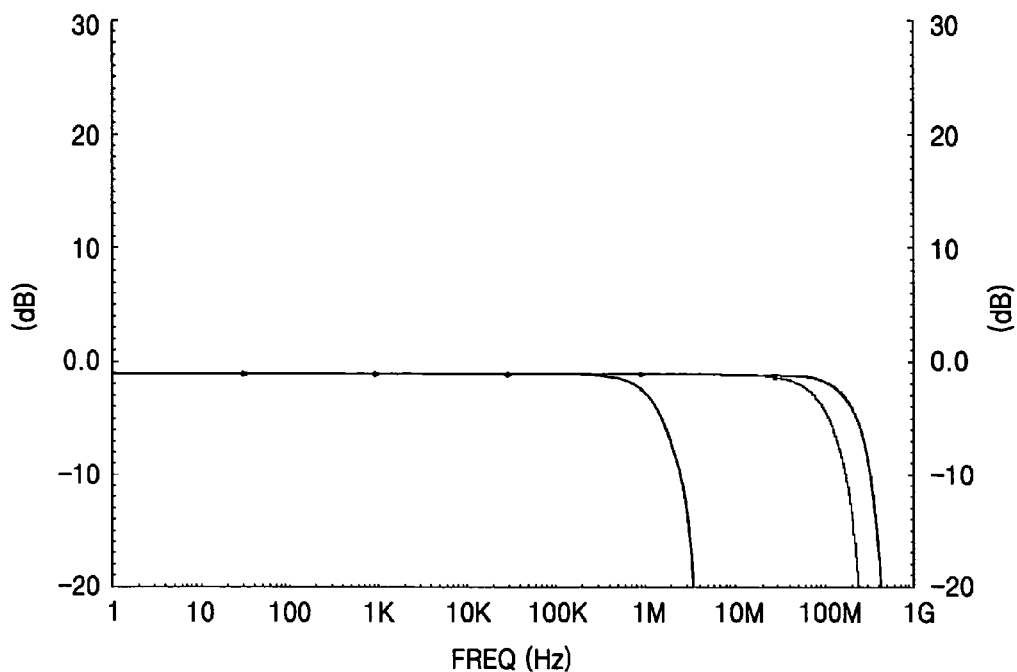
FIG. 6 illustrates an example frequency response obtained using a Gm-C filter other than an operating amplifier for boosting in the equalizer of FIG. 5.

FIG. 6 illustrates an example frequency response of the output Vout_flt of the biquad low pass node of the third biquad circuit 508 of the example equalizer 500. FIG. 6 shows an example of scaling the normalized capacitances and transconductances to control the −3 dB frequency to be 1.35 MHz, 95.5 MHz and 173.8 MHz. It may be shown from FIG. 6 that a parasitic capacitance added to the band pass node and low pass node of the third biquad circuit 508 is small. In addition, it may be shown that a filtering operation may be performed in a frequency band ranging from 1.35 MHz to 173.8 MHz when the constant K is 0, capacitances are scaled with a desired scaling factor to be fixed to specific values and transconductances are varied.

Figure 7:
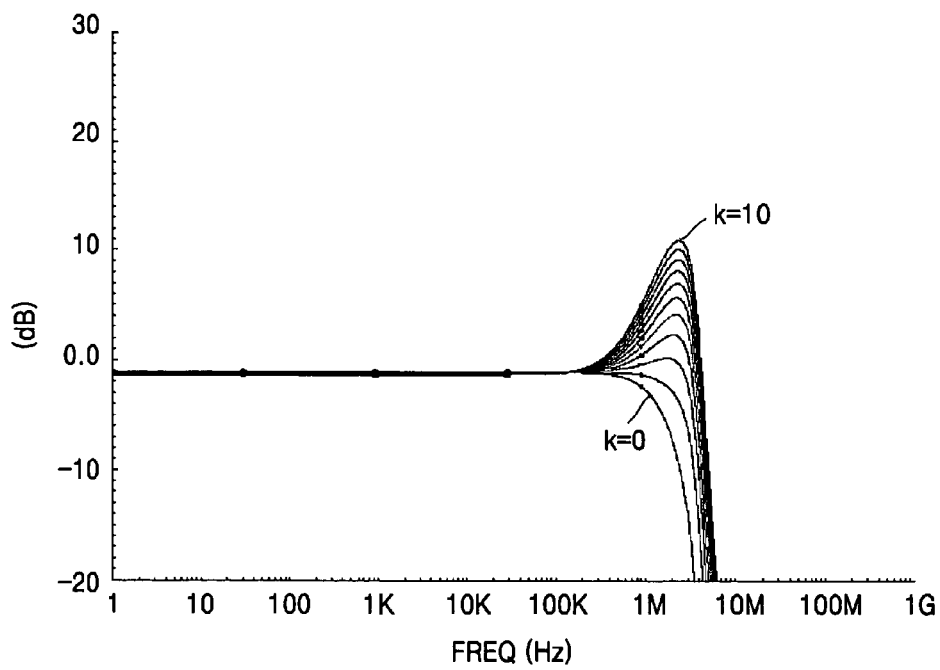
FIG. 7 illustrates an example variation in a boosting gain in response to a constant K when the −3 dB frequency is 1.35 MHz using the example equalizer of FIG. 5.

FIG. 7 illustrates an example variation in a boosting gain in response to the constant K when the −3 dB frequency is 1.35 MHz using the example equalizer 500 of FIG. 5. That is, FIG. 7 shows an example simulation result obtained by scaling capacitances such that the −3 dB frequency becomes 1.35 MHz and varying the constant K using an operational amplifier for boosting to change the boosting gain. The constant K is varied to 0, 1, 2, 3, 4, 5, 6, 7, 8, 9 and 10. The boosting gain is not obtained when K=0 and the effect of the boosting gain becomes large when K=10. As can be seen from FIG. 7, the example equalizer 500 may control the boosting gain by adjusting the gain constant K. In addition, the example equalizer 500 may obtain a desired boosting gain only by controlling the gain constant K without changing the sizes of the transconductors because the transconductors are not affected by the gain constant K even when the gain constant K is varied.

Figure 8:
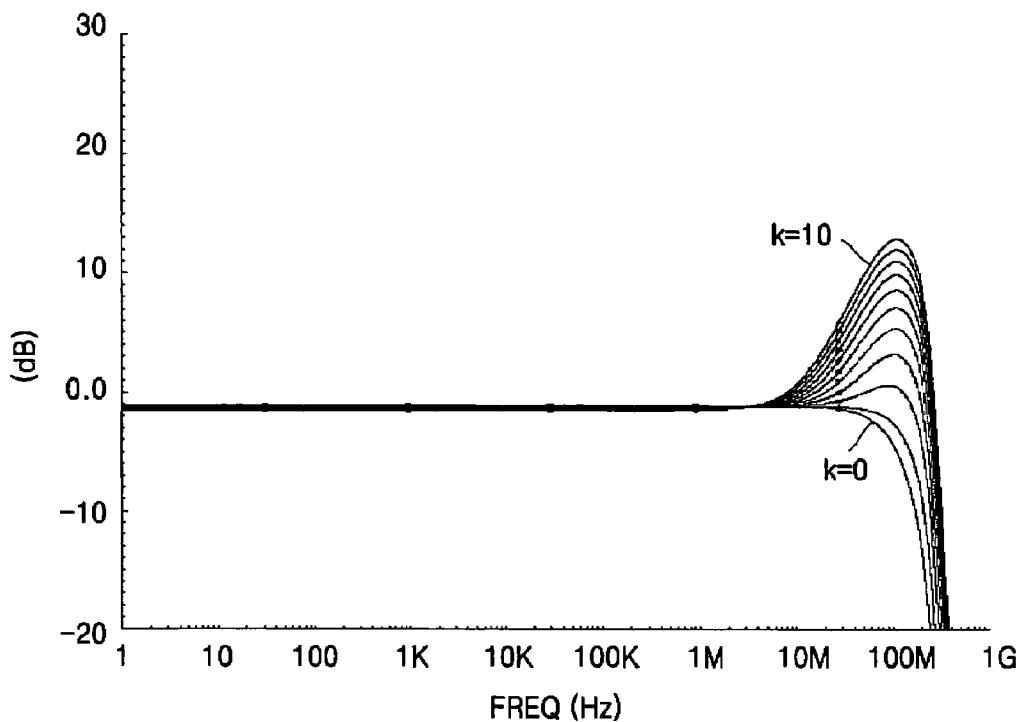
FIG. 8 illustrates an example variation in the boosting gain in response to the constant K when the −3 dB frequency is 95.5 MHz using the example equalizer of FIG. 5.
Figure 9:
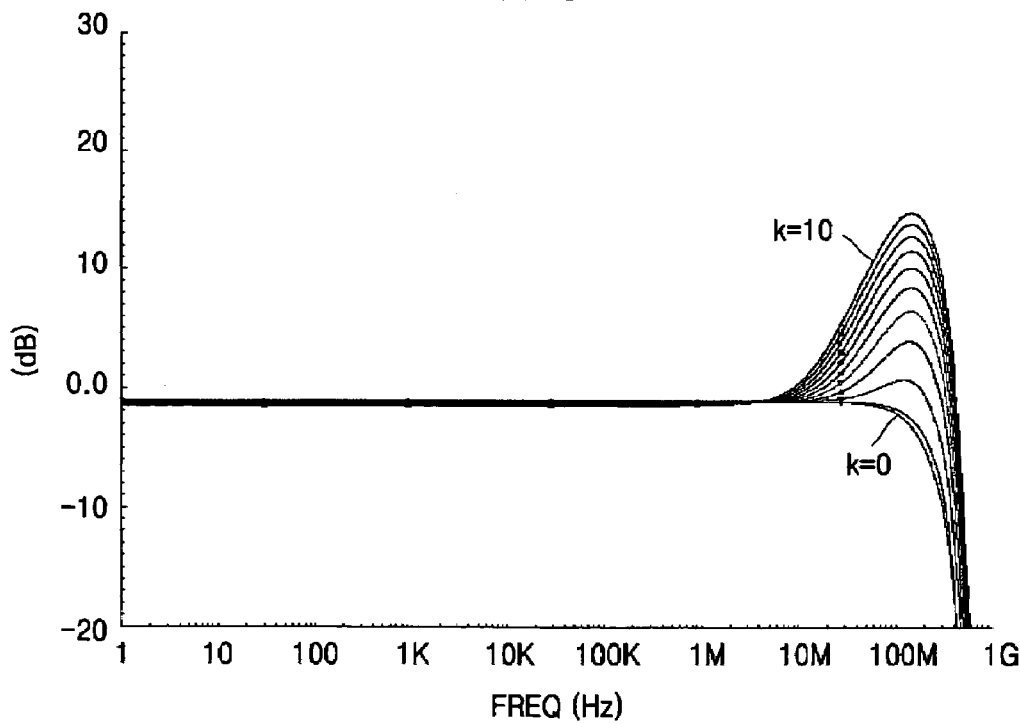
FIG. 9 illustrates an example variation in the boosting gain in response to the constant K when the −3 dB frequency is 173.8 MHz using the example equalizer of FIG. 5.

FIG. 8 illustrates an example variation in the boosting gain in response to the constant K when the −3 dB frequency is 95.5 MHz using the example equalizer 500 of FIG. 5, and FIG. 9 illustrates an example variation in the boosting gain in response to the constant K when the −3 dB frequency is 173.8 MHz using the example equalizer 500.

It may be shown from FIGS. 7, 8 and 9 that the example equalizer 500 scales capacitances with a desired scaling factor to fix the capacitances to specific values, varies transconductances to change the −3 dB frequency, and/or maintains the boosting characteristic even when the boosting gain is varied with the −3 dB frequency. Furthermore, the example equalizer 500 may use a smaller capacitance scaling factor to obtain a desired −3 dB frequency even with a small transconductance because it has a small parasitic capacitance. That is, equalizers according to example embodiments of the present invention may control the capacitance scaling and/or boosting gain. Equalizers according to example embodiments of the present invention may generate a smaller parasitic capacitance when controlling the capacitance scaling and boosting gain, and thus equalizer characteristic need not be changed.

While equalizers using fourth-order and seventh-order Gm-C filters have been explained in the aforementioned example embodiments, equalizer of example embodiments of the present invention are not limited to fourth-order and seventh-order equalizers.

According to example embodiments of the present invention, the bandwidth of a filter may be increased and a specific boosting gain may be maintained while reducing the size of a circuit constructing an equalizer. Furthermore, capacitance scaling and a boosting gain may be controlled. Moreover, only a small parasitic capacitance may be generated when the capacitance scaling and boosting gain are controlled, and thus the equalizer characteristic need not be varied.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An equalizer comprising:
    a first biquad circuit including a first input node, a first biquad band pass node, and a first biquad low pass node;
    a second biquad circuit including a second input node connected to the first biquad low pass node, a second biquad band pass node, and a second biquad low pass node;
    a first summing circuit summing an output of the second biquad band pass node and an output of the second biquad low pass node;
    a second summing circuit subtracting an output of the first biquad low pass node from output of the first summing circuit and amplifying the summed result by a constant; and
    a third summing circuit summing up the output of the second summing circuit and the output of the second biquad low pass node,
        wherein the first and second biquad circuits are Gm-C biquad circuits having transconductors connected in a self-feedback configuration to the first and second biquad band pass nodes, respectively.

2. The equalizer of claim 1, wherein the first and third summing circuits are first and second operational amplifiers, respectively, each summing two input signals.

3. The equalizer of claim 2, wherein the second summing circuit comprises:
    a third operational amplifier subtracting an output of the first biquad low pass node from an output of the first summing circuit; and
    a fourth operational amplifier amplifying an output of the third operational amplifier by a constant.

4. The equalizer of claim 1, wherein the first biquad circuit comprises:
    a first transconductor connected between the first input node and the first biquad band pass node;
    a first capacitor connected between the first biquad band pass node and a ground voltage;
    a second transconductor connected to the first biquad band pass node in a self-feedback configuration;
    a third transconductor connected between the first biquad band pass node and the first biquad low pass node;
    a fourth transconductor connected between the first biquad band pass node and the first biquad low pass node, the fourth transconductor forming a feedback loop with the third transconductor; and
    a second capacitor connected between the first biquad low pass node and the ground voltage.

5. The equalizer of claim 4, wherein the first and third transconductors are non-inverting transconductors and the second and fourth transconductors are inverting transconductors.

6. The equalizer of claim 4, wherein the second biquad circuit comprises:
    a fifth transconductor connected between the second input node and the second biquad band pass node;
    a third capacitor connected between the second biquad band pass node and the ground voltage;
    a sixth transconductor connected to the second biquad band pass node in a self-feedback configuration;
    a seventh transconductor connected between the second biquad band pass node and the second biquad low pass node;
    an eighth transconductor connected between the second biquad band pass node and the second biquad low pass node, the eighth transconductor forming a feedback loop with the seventh transconductor; and
    a fourth capacitor connected between the second biquad low pass node and the ground voltage.

7. The equalizer of claim 6, wherein the fifth and seventh transconductors are non-inverting transconductors and the sixth and eighth transconductors are inverting transconductors.

8. The equalizer of claim 1, further comprising:
    a plurality of biquad circuits, a last of the plurality of biquad circuits connected to the first input node of the first biquad circuit; and
    a lossy integrator connected to a first of the plurality of biquad circuits.

9. The equalizer of claim 8, wherein the lossy integrator comprises:
    a first transconductor connected between an input node and an integrating node;
    a second transconductor connected to the integrating node in a self-feedback configuration; and
    a first capacitor connected between the integrating node and a ground voltage.

10. The equalizer of claim 9, wherein the first transconductor is a non-inverting transconductor and the second transconductor is an inverting transconductor.

11. An equalizer comprising:
    n (where n is an integer $\geq 2$) biquad circuits each include an input node, a biquad band pass node and a biquad low pass node;
    a first summing circuit summing an output of the biquad band pass node of the nth biquad circuit and an output of the biquad low pass node of the nth biquad circuit;
    a second summing circuit subtracting the output of the biquad low pass node of the (n−1)th biquad circuit from the output of the first summing circuit and amplifying the summed result by a constant; and
    a third summing circuit summing an output of the second summing circuit and the output of the biquad low pass node of the nth biquad circuit,
        wherein the n biquad circuits are Gm-C biquad circuits each having transconductors connected in a self-feedback configuration to the biquad band pass node of the corresponding n biquad circuit.

12. The equalizer of claim 11, further comprising a lossy integrator connected to the input node of the first biquad circuit.

13. The equalizer of claim 12, wherein each of the biquad circuits comprises:
- a first transconductor connected between the input node and the biquad band pass node of the corresponding biquad circuit;
- a first capacitor connected between the biquad band pass node of the corresponding biquad circuit and a ground voltage;
- a second transconductor connected in a self-feedback configuration to the biquad band pass node of the corresponding biquad circuit;
- a third transconductor connected between the biquad band pass node and the biquad low pass node of the corresponding biquad circuit;
- a fourth transconductor connected between the biquad band pass node and the biquad low pass node of the corresponding biquad circuit, the fourth transconductor forming a feedback loop with the corresponding third transconductor; and
- a second capacitor connected between the biquad low pass node of the corresponding biquad circuit and the ground voltage.

14. The equalizer of claim 12, wherein the lossy integrator comprises:
- a first transconductor connected between an input node and an integrating node;
- a second transconductor connected in a self-feedback configuration to the integrating node; and
- a first capacitor connected between the integrating node and the ground voltage.

15. The equalizer of claim 12, wherein the first and third summing circuits are first and second operational amplifiers, respectively each summing two input signals.

16. The equalizer of claim 12, wherein the second summing circuit comprises:
- a third operational amplifier subtracting the output of the biquad low pass node of the (n−1)th biquad circuit from the output of the first summing circuit; and
- a fourth operational amplifier amplifying the output of the third amplifier by a constant.

17. The equalizer of claim 12, wherein each of the n (where n is an integer $\geq 2$) biquad circuits includes at least one transconductor and each of the first summing circuit, the second summing circuit, and the third summing circuit includes at least one operational amplifier.

18. An equalizer comprising:
- a filtering part including n (where n is an integer $\geq 2$) biquad circuits, each of the n biquad circuits including at least one transconductor, receiving an input voltage and outputting a filtered voltage; and
- an equalizing part including at least one operational amplifier, receiving at least one intermediate voltage of the n biquad circuits and at least one filtered voltage of the n biquad circuits from the filtering part, generating an equalized voltage from the at least one received intermediate voltage and the at least one received filtered voltage, and outputting the equalized voltage,
  wherein the equalizing part multiplies the at least one received intermediate voltage and the at least one received filtered voltage by corresponding coefficients, respectively, and generates the equalized voltage by summing at least one multiplied intermediate voltage and at least one multiplied filtered voltage.

* * * * *